(12) United States Patent
Inoue et al.

(10) Patent No.: US 6,696,909 B2
(45) Date of Patent: Feb. 24, 2004

(54) CIRCUIT MODULE AND METHOD FOR MOUNTING THE SAME

(75) Inventors: Keiji Inoue, Kyoto-fu (JP); Tsutomu Ishige, Kyoto-fu (JP); Yoshiteru Ohta, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/736,062

(22) Filed: Dec. 13, 2000

(65) Prior Publication Data

US 2001/0004941 A1 Jun. 28, 2001

(30) Foreign Application Priority Data

Dec. 13, 1999 (JP) ............................... 11-353535

(51) Int. Cl.7 .................................. H01F 5/00
(52) U.S. Cl. ........................ 336/200; 336/90; 336/98; 336/197; 336/210
(58) Field of Search ............................... 336/90, 92, 98, 336/65, 67, 68, 196, 197, 200, 210; 361/752

(56) References Cited

U.S. PATENT DOCUMENTS

| 4,206,435 | A | * | 6/1980 | Harris et al. | ............... 336/65 |
| 5,055,971 | A | * | 10/1991 | Fudala et al. | ............... 336/210 |
| 5,973,923 | A | * | 10/1999 | Jitaru | ............... 361/752 |
| 6,118,347 | A | * | 9/2000 | Ohira | ............... 361/752 |
| 6,359,542 | B1 | * | 3/2002 | Widmayer et al. | ............... 336/67 |

FOREIGN PATENT DOCUMENTS

| JP | 8107024 | 4/1996 |
| JP | 1140425 | 12/1999 |

* cited by examiner

Primary Examiner—Tuyen T. Nguyen
(74) Attorney, Agent, or Firm—Keating & Bennett, LLP

(57) ABSTRACT

A circuit module has a circuit board on which electronic components are mounted and a covering member which has a plate portion and one or more supporting portions. The supporting portions fix the plate portion parallel to the surface of the circuit board. The covering member can be chucked by a chucking device to mount the circuit module to a mother circuit board.

22 Claims, 5 Drawing Sheets

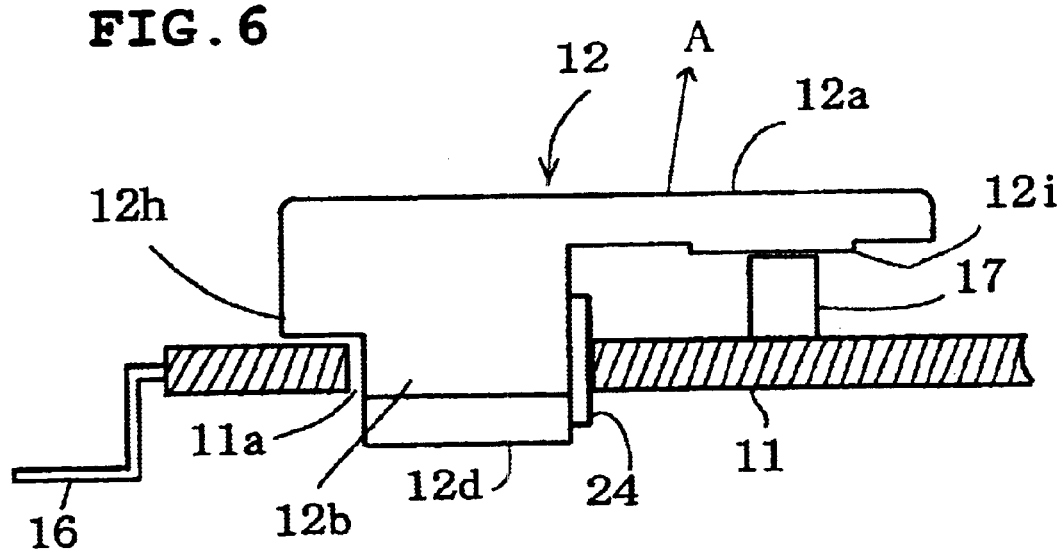
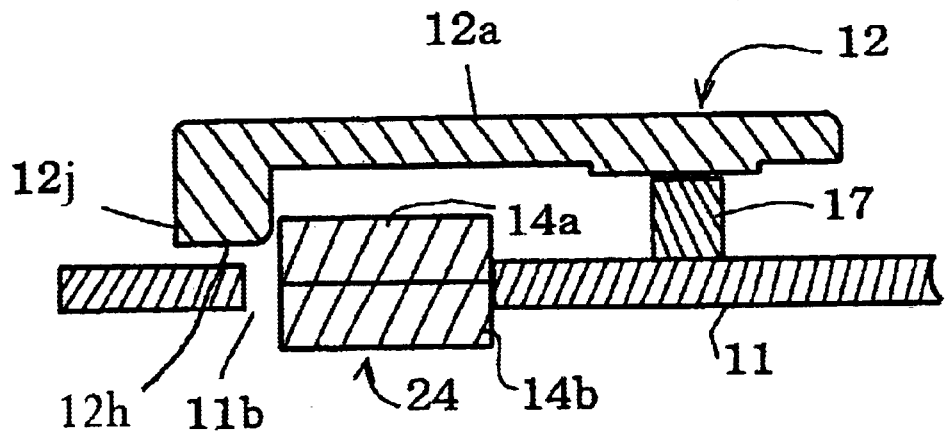
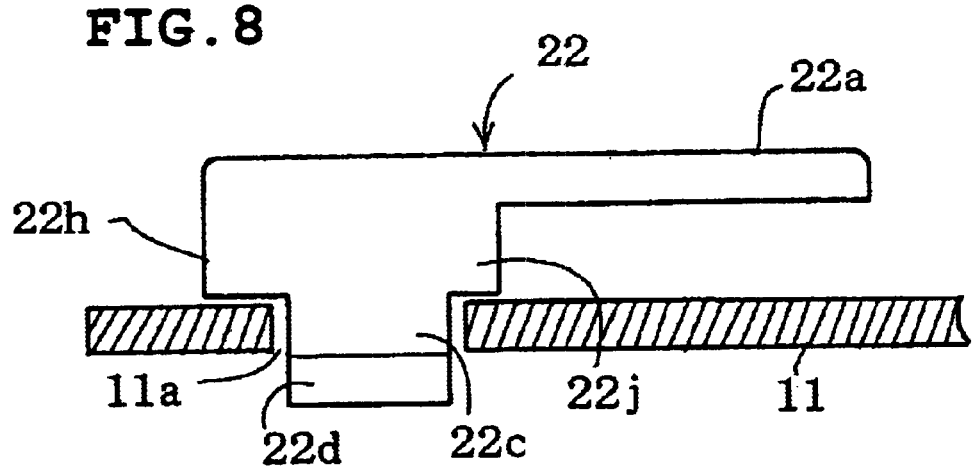

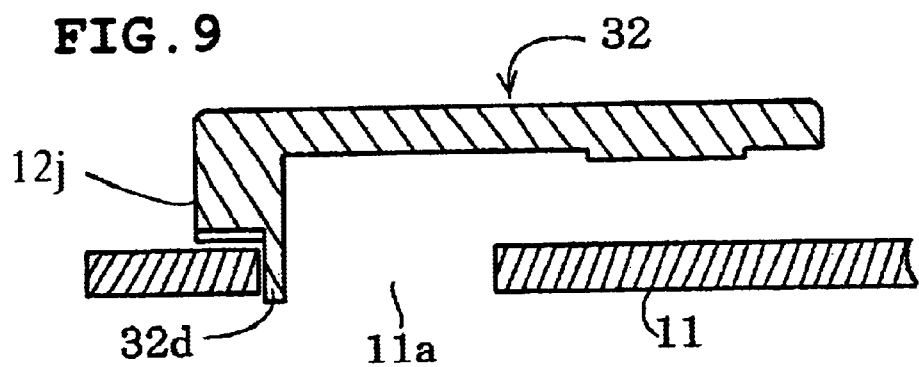
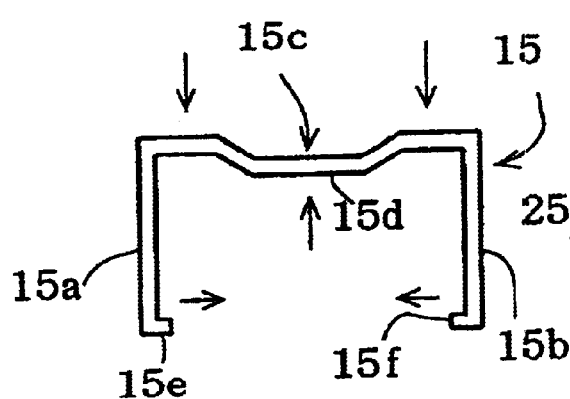 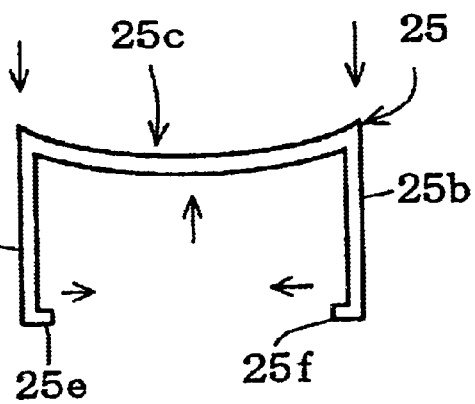
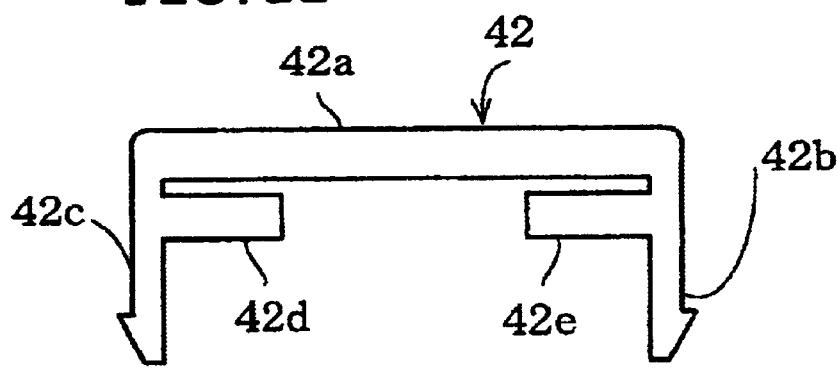

CIRCUIT MODULE AND METHOD FOR MOUNTING THE SAME

BACKGROUND OF THE INVENTION

1. Field of the Invention

The present invention relates to circuit modules mounted in communication equipment, etc., and more particularly relates to a circuit module such as a surface mountable DC—DC converter. The present invention also relates to a method for mounting the circuit module on a mother circuit board incorporated in communication equipment, etc.

2. Description of the Related Art

Recently, circuit boards incorporated in communication devices have been loaded with circuit modules along with various electronic components. From the viewpoint of working efficiency, the process of mounting the electronic components, etc., is preferably automated. To this end, each of the electronic components is formed to have a shape suitable for being chucked and carried by a chucking device. As described in Japanese Unexamined Patent Application Publication No. 8-107024, for example, a component such as a transformer formed by winding a conductive wire is covered with a special casing so as to facilitate the chucking process performed by the chucking device.

This will be more specifically described below with reference to FIG. 13. A bobbin 1 around which a coil is formed is combined with end portion supporting plates 2 and 2 which are provided under the bobbin 1 at both ends in the axial direction. Lead terminals 3 and 3 horizontally lead out from the end portion supporting plates 2 and 2. A conductive wire is wound around the bobbin 1 to form the transformer coil. A pair of E cores 4 and 4 are fixed with the bobbin 1, projections at the midsections of the E cores 4 and 4 being fit into the central opening of the bobbin 1 from both sides in the horizontal direction. The bobbin 1 and the E cores 4 and 4 are covered with a casing 5 which has an upper plate 6 with a flat surface. The casing 5 includes core clamping portions 7 and 7 for interlocking the pair of E cores 4 and 4 with each other. The clamping portions 7 and 7 are extended vertically downward from the two opposing sides of the upper plate 6 and are bent. In addition, the casing 5 also includes bobbin crimping portions 8 which are extended downward from the other two opposing sides of the upper plate 6 and are bent. The bobbin crimping portions 8 prevents the rattling of the bobbin 1 and the E cores 4 and 4. This unit is mounted on a circuit board by chucking the upper surface of the casing 5 at the midsection thereof with the chucking device.

With regard to a circuit module in which electronic components are mounted on a small circuit board at high density, however, the circuit module cannot be chucked and lifted by the chucking device since the electronic components form concavities and convexities on the circuit board. A communication device, for example, includes a power supply for providing electric power, and a DC—DC converter is separately mounted on a mother circuit board which is incorporated in the communication device. The DC—DC converter contains transformers, rectifiers, switching transistors, ICs, capacitors, etc., on a multi-layer circuit board provided with electric wires not only on the surface but also between the layers. Such a circuit module weighs 5 to 10 g, which is much heavier than other electronic components. Accordingly, even when a transformer having the above-described construction is used, the circuit module cannot be lifted and carried since the upper surfaces of the electronic components are not large enough to allow the required chucking force.

In addition, since circuit modules such as DC—DC converters are mounted on mother circuit boards incorporated in communication devices, the circuit modules are required to be as light and thin as possible. The electronic components mounted on the DC—DC converter differ in height, and the tallest component of all is generally the transformer. Thus, to make the DC—DC converter thinner, the inventors have used, instead of the transformer having the above-described construction, a transformer formed by the following process. The multi-layer circuit board is used as the circuit board of the DC—DC converter, and ring-type or helical-type coil patterns are formed by utilizing the surface and the region between layers of the multi-layer circuit. The coil patterns are connected by via holes so as to form two coils with the required numbers of windings. Through holes are formed at the center and in the surrounding region of the coils, and leg portions of cores are inserted into the through holes. The cores are fixed to the circuit board with a metal fitting, so as to from the transformer.

Even with the above-described constructions, the cores fixed to the multi-layer circuit make the transformer the tallest component compared to other electronic components. For making such a circuit module chuckable by the chucking device, the inventors have experimentally manufactured circuit modules having a chucking surface. The chucking surface was formed by disposing a chucking plate over the core, the tallest component, and the next tallest of the electronic components, by applying several tens of milligrams of an adhesive with high viscosity.

The electronic components mounted on the multi-layer circuit board, however, differ in height, and thus it is difficult to maintain the chucking plate parallel to the surface of the multi-layer circuit board. Accordingly, there is a risk that the chucking plate will tilt relative to the multi-layer circuit board. When the chucking plate tilts by 2° relative to the multi-layer circuit board, for example, the chucking device cannot chuck and carry the circuit board.

In addition, the cores fixed by the metal fitting rattle in the through holes formed in the multi-layer circuit board. Accordingly, it is difficult to maintain the chucking plate parallel to the multi-layer circuit board when the chucking plate is fixed over the cores and another electronic component. Thus, the workability is degraded.

Furthermore, the viscosity of the adhesive to fix the chucking plate on the electronic components is high, so that it is difficult to apply small amounts of adhesive such as several tens of milligrams. Accordingly, there is a risk that the adhesive will soften during the process of heat curing so that the chucking plate moves by itself, and there is also a risk in that the adhesion force may not be sufficient so that the chucking plate moves while the circuit module is carried into a curing oven. Thus, there is a risk that the chucking plate cannot be placed at a predetermined position.

Furthermore, in addition to the process of reflowing for fixing the electronic components on the circuit board as surface mounted devices, the process of applying the adhesive manually and the process of heat curing are required. Thus, the number of processes is increased and the automated assembly is interrupted, providing drawbacks in that the accuracy of the processing and the working efficiency are degraded.

SUMMARY OF THE INVENTION

Accordingly, an object of the present invention is to provide a circuit module which realizes an automated mounting process.

Another object of the present invention is to provide a method for mounting a circuit module on a mother circuit board.

The circuit module of the present invention comprises a covering member which has a plate portion and one or more supporting portions and a circuit board on which electronic components are mounted. The supporting portions fix the plate portion to be parallel to the surface of the circuit board. According to the structure, the covering member is directly attached to the circuit board, and the plate portion of the covering member is supported in parallel to the circuit board. Accordingly, the tilt of the plate portion is small, and sufficient area for chucking is provided when the chucking device chucks and lifts the circuit module. Thus, chucking and carrying of the circuit module are more reliably performed by the chucking device.

In addition, the covering member is fixed to the circuit board using the through holes formed in the circuit board and the attaching portions of the supporting portions provided to the covering member. Thus, the process of attaching the covering member is extremely simplified, providing improved workability. The core unit is supported by the supporting portions, and is pressed against the surface of the multi-layer circuit board by the plate portion of the covering member. Accordingly, the cores are retained at the predetermined position, so that the cores do not rattle or move. When the pressing portion for pressing one of the cores against the inner walls of the through holes is additionally applied, the core may be retained in any direction in three dimensions. This stabilizes the magnetic condition of the transformer.

The covering member is preferably attached directly to the multi-layer circuit board. Accordingly, the plate portion may be laid on one of the electronic components mounted on the multi-layer circuit board so as to ensure that the plate portion is parallel to the multi-layer circuit board, and sufficient area for chucking is provided. Thus, the covering member does not tilt relative to the chucking device, and the circuit module, which is much heavier than independent electronic components, may be reliably chucked and carried by the chucking device. In addition, the plate portion of the covering member may be disposed at the center of the multi-layer circuit board, so that the circuit module may be lifted by the chucking device at the center of gravity and be carried in a balanced manner.

In addition, the step portion and the hook portions of the attaching portions provided to the covering member fix the covering member to the multi-layer circuit board. Accordingly, the process of attaching the covering member is extremely simplified, providing improved workability. In addition, the coils of the transformer are formed at the same time the electric wires are formed in the multi-layer circuit board. Thus, the transformer is formed simply by attaching the core to the multi-layer circuit board. Furthermore, the core unit is fixed using the covering member so that the cores are easily prevented from rattling or moving relative to the multi-layer circuit board. Accordingly, the number of processes for manufacturing the circuit module is reduced, and an automated manufacturing process may be realized, providing improved working efficiency.

In addition, the plate portion of the covering member may be provided with the protrusion at the bottom surface with which another electronic component supports the plate portion. With such a construction, the plate portion may be maintained to be parallel even when the plate portion is thin or long. Accordingly, vibration or impact force applied to the plate portion may be spread out, and an excessive stress applied to the supporting portion may be relaxed.

The circuit module formed by mounting electronic components on the daughter circuit board is much heavier compared to other independent electronic components. With the method for mounting the circuit module in accordance with the third aspect of the present invention, however, such a circuit module may be mounted on the mother circuit board by using the chucking device in the same way as for the other electronic components. This is achieved by providing the chucking plate on the circuit board. Accordingly, the manufacturing of the circuit board contained in communication equipment, etc., may be automated, significantly improving working efficiency.

For the purpose of illustrating the invention, there is shown in the drawings several forms which are presently preferred, it being understood, however, that the invention is not limited to the precise arrangements and instrumentalities shown. Other features and advantages of the present invention will become apparent from the following description of the invention which refers to the accompanying drawings.

BRIEF DESCRIPTION OF THE DRAWING(S)

Figures 3A, 3B, 3C:
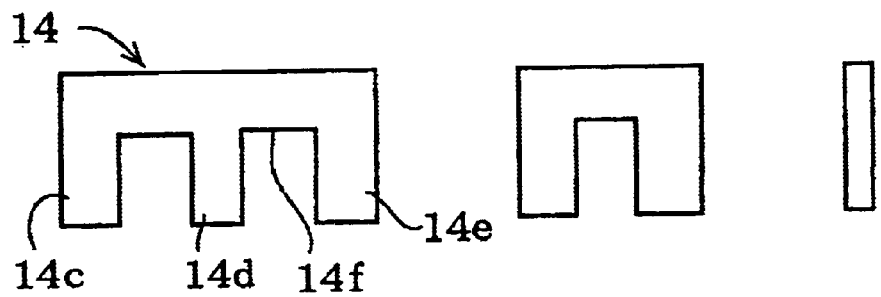

FIGS. 3A, 3B, and 3C are side views of cores used in circuit modules according to the embodiments of the present invention.

Figure 4:
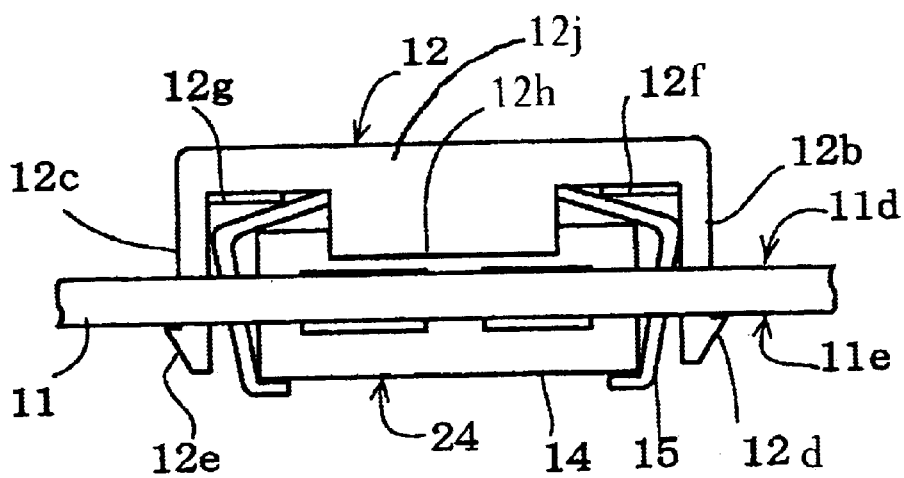

FIG. 4 is a rear view of the circuit module according to the present invention.

Figure 5:
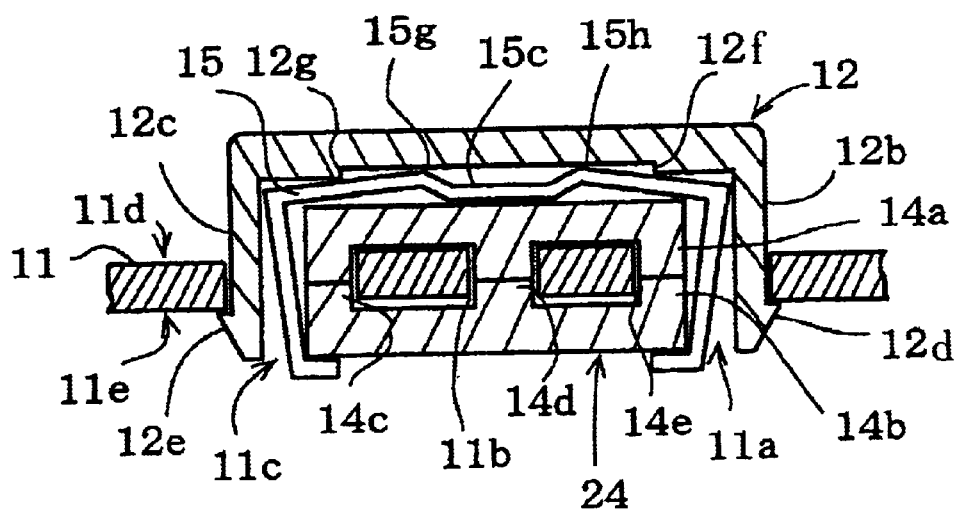

FIG. 5 is a sectional view of a part of the circuit module where the cores are attached.

FIG. 6 is a sectional side view of a part of the circuit module where the covering member is attached.

FIG. 7 is a sectional side view of a substantial part in the part shown in FIG. 6

FIG. 8 is a sectional side view of a part of a circuit module according to another embodiment of the present invention.

FIG. 9 is a sectional side view showing a covering member used in a circuit module according to another embodiment of the present invention.

FIGS. 10A and 10B are side views of metal fittings used in the circuit module of the present invention.

FIG. 11 is a rear view of a covering member incorporated in a circuit module according to another embodiment of the present invention.

Figure 12:
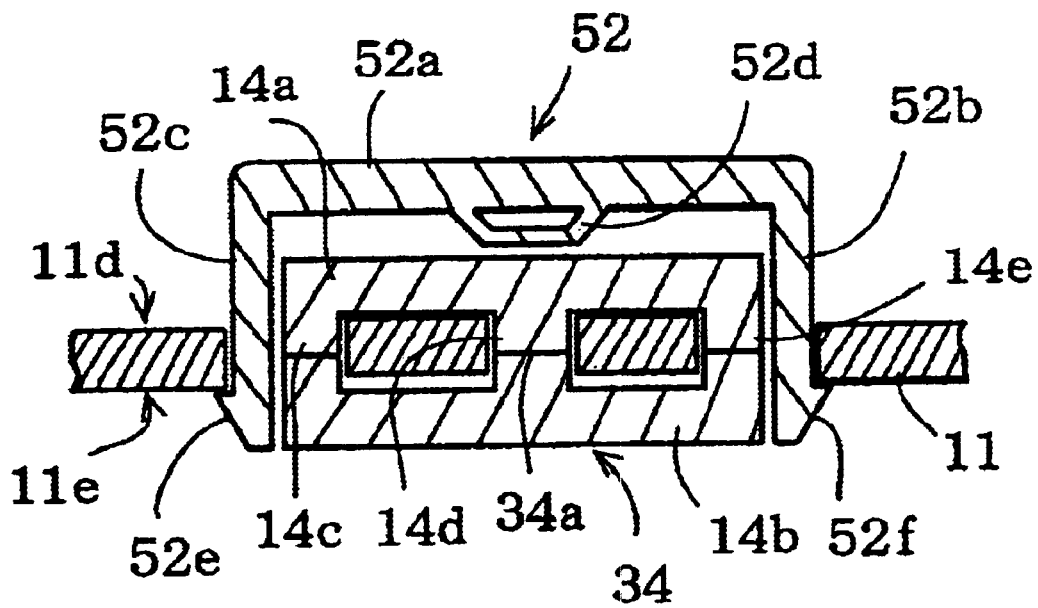

FIG. 12 is a sectional view showing a part of a circuit module where the core is attached, according to another embodiment of the present invention.

Figure 13:
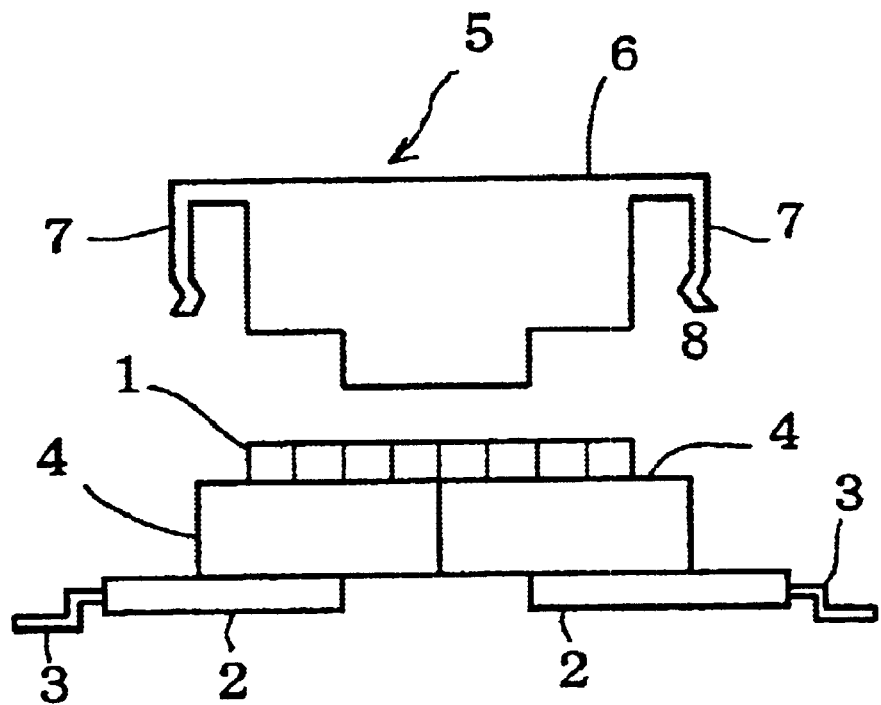

FIG. 13 is an exploded side view of a conventional transformer.

DETAILED DESCRIPTION OF EMBODIMENTS OF THE INVENTION

The circuit module according to the present invention comprises a covering member which has a plate portion and supporting portions and a circuit board on which electronic components are mounted, and the supporting portions fix the plate portion to be parallel to the surface of the circuit board.

According to the above-described construction, the plate portion which is used for chucking the covering member has a flat surface. In addition, the plate portion of the covering member is precisely parallel to the surface of the circuit board. Thus, in the process of mounting the circuit module on the mother circuit board for the communication device, etc., the surface of the plate portion does not tilt relative to the chucking device so that the chucking device can chuck, lift, and carry the circuit module. In addition, the covering member is supported by the supporting portions, so that it may be provided irrespective of the heights of the electronic components which are mounted on the circuit board. The circuit board is provided with lead terminals, which may be connected by soldering to the circuit wiring formed on the mother circuit board of communication equipment, etc.

The above-described circuit module may be constructed so that through holes are drilled in the circuit board, the covering member is formed by extending the supporting portions from the plate portion in the direction perpendicular to the plate portion, and the supporting portions are provided with attaching portions at distal ends, the attaching portions being engaged with the through holes. The number of the through holes and the supporting portions may be one, respectively, and the through holes may be formed either in a polygonal shape or in a circular shape. From the viewpoint of the strength of attachment and stability, a plurality of through holes and supporting portions are provided, for example, two of each.

The construction of the circuit board according to the present invention may be such that the circuit board is formed to be a multi-layer circuit board having electric wires between layers, and wherein a transformer is constructed, the transformer including coils, which are formed by using coil patterns formed in the multi-layer circuit board, and cores, which form magnetic paths by inserting one or more leg portions into the through holes which are positioned at the center and in surrounding region of the coils. By applying such a construction, the entire body of the circuit module would be light and thin compared to the case in which an independent transformer is mounted on the multi-layer circuit board. The coil patterns may be formed on the surface and between the layers of the multi-layer circuit board at the same time the electric wires are formed. The coil patterns may be formed with a conductive material in the shape of spirals, rings, arcs, etc., in accordance with requirements. The coil patterns are connected by via holes to forms two coils, which are the primary coil and the secondary coil. The two coils are aligned in the thickness direction of the multi-layer circuit board. The cores are used to form magnetic paths for the two coils. The two cores are attached to each other from the upper and the lower sides of the multi-layer circuit board to form magnetic paths, and are held by a metal fitting. This construction makes the transformer section thinner and simpler.

The cores are attached to the multi-layer circuit board at the part where the through holes are formed. Preferably, the two cores are attached to each other from the upper and the lower sides of the circuit board, and are fixed to each other by an elastic metal fitting, and wherein one of the cores is immovably held between the plate portion of the covering material and the multi-layer circuit board. The cores may be U-shaped cores, E cores, etc., which are already commonly used in the art. As for the metal fitting, a leaf spring made of phosphor bronze, stainless steel, etc., may be used. The areas of the through holes are larger than the cross sections of the leg portions of the cores, and include sufficient clearance. Thus, even when the leg portions of the cores are inserted into the through holes and the metal fitting fixes the cores to each other across the multi-layer circuit board, the cores move inside the through holes, altering the magnetic state. Accordingly, the plate portion of the covering member presses the cores against the multi-layer circuit board via the metal fitting, preventing rattling or displacement of the cores.

In addition, the covering member preferably comprises a pressing portion for pressing the leg portions of one of the cores against the inner walls of the through holes. The pressing portion presses the side surface of the core, so that the leg portions of the core are pressed against the inner walls of the through holes at the side opposing to the side where the pressing portion is disposed. Accordingly, rattling or displacement of the cores is prevented, as described above.

It is preferable that the covering member has a plate portion and one or more supporting portions, and the supporting portions are engaged with the through holes so as to dispose the plate portion in parallel to the multi-layer circuit board.

According to this construction, the covering member is provided with the plate portion, which is to be chucked by the chucking device. Thus, in the process of mounting the circuit module on the mother circuit board of communication equipment, etc., sufficient chucking force is obtained. More specifically, since the plate portion of the covering member has a flat surface and sufficient area, the aperture of the chucking device may be enlarged in accordance with the weight of the circuit module. In addition, the plate portion of the covering member is arranged so as to be parallel to the surface of the multi-layer circuit board. Accordingly, in the process of mounting the circuit module, the chucking device opposes the surface of the plate portion without being tilted relative to the surface of the plate portion. The tilt of the plate would be less than the chucking limit, for example, less than 2° relative to the horizontal. In addition, the covering member is fixed by inserting the supporting portions into the same through holes as the through holes into which the leg portions of the cores of the transformer are inserted, so that additional space for through holes dedicated for inserting the supporting portions are not necessary. Accordingly, the electronic components may be densely arranged. The vertical position of the plate portion of the covering member relative to the surface of the multi-layer circuit board is determined with consideration of the height of the cores. The multi-layer circuit board and the covering member are made from a synthetic resin. The multi-layer circuit board is made from, for example, an epoxy resin containing fiberglass, and the covering member is made from, for example, a polyester resin containing fiberglass.

The supporting portions may be provided with attaching portions at distal ends, the attaching portions including a step portion which contacts one of the surfaces of the multi-layer circuit board and hook portions which are engaged with the edges of the through holes at the other surface of the multi-layer circuit board. Accordingly, the multi-layer circuit board is clamped from both the upper and the bottom surfaces by the step portion and the hook portions, so that the covering member is fixed to the multi-layer circuit board with sufficient strength. In addition, the step portion provided to the supporting portions is formed so that the end surface is parallel to the upper surface of the plate portion. Thus, the plate portion is maintained to be parallel to the surface of the multi-layer circuit board.

In the above-described case, the two cores are preferably attached to each other from the upper and the lower sides of the circuit board, and are fixed to each other by an elastic metal fitting. In order to form closed magnetic paths at the coil section of the transformer by using the cores, the leg portions of the two cores are inserted through the through holes, attaching the two cores together. The two cores are fixed to each other by the metal fitting. The cores may be E cores, U-shaped cores, etc., which are known in the art. The metal fitting is formed with a spring, so that the differences caused during the fabrication of the cores are chuckable by elasticity. The metal fitting may be U-shaped.

Merely attaching the two cores with the metal fitting cannot prevent the rattling of the cores. Thus, the supporting portions of the covering member preferably have such dimensions that the plate portion presses the cores against the surface of the multi-layer circuit board. In such a construction, the cores are pressed by the bottom surface of the plate portion of the covering member via the metal fitting. Accordingly, the cores are pressed against the surface of the multi-layer circuit board, so that they cannot rattle. Specifically, the displacement of the cores in the direction perpendicular to the surface of the multi-layer circuit board is prevented. When two supporting portions are engaging with two through holes, the cores may also be retained in the direction in which the leg portions are arranged by applying a construction in which the cores are disposed between the two supporting portions, which support the leg portions of the cores via the metal fitting.

In order to prevent the rattling of the core, such construction may be applied wherein the covering member comprises a pressing portion for pressing the leg portions of one of the cores against the inner walls of the through holes. The pressing portion extends in the same direction in which the supporting portions extend. More specifically, the pressing portion extends downward in the direction perpendicular to the plate portion, and presses at least one of the cores at the side surface. Accordingly, one of the cores is surrounded by the two supporting portions and the pressing portion so as to be clamped from the three directions. The side surface of the core is pressed by the pressing portion, and the leg portions of the core are pressed against the inner walls of the through holes at the side opposing the side where the pressing portion is disposed. Thus, the core does not rattle in any of the three dimensions. The pressing portion may be provided to the two supporting portions.

There may be a case in which the covering member cannot be disposed at the center of the multi-layer circuit board, in accordance with the arrangement of the electronic components mounted on the circuit module, for example, a DC—DC converter. In such a case, the plate portion of the covering member must be extended to the center of the multi-layer circuit board. This is because the chucking device preferably chucks the circuit module at the center of gravity.

When the supporting portions of the covering member are away from the center of the multi-layer circuit board, however, the plate portion of the covering member may tilt and no longer be parallel to the surface of the multi-layer circuit. Specifically when the plate portion is thin, there is a risk that the extended plate tilts upward or downward at the free end when the chucking device chucks the plate portion. In such a case, a gap generated between the chucking device and the plate portion may lead to a chucking error. In order to eliminate such a risk, the plate portion of the covering member is preferably provided with a protrusion on the bottom surface, the protrusion contacting the top portion of one of the electronic components other than the transformer. Accordingly, the protrusion compensates for the difference in heights between the electric component used as a supporter and the cores, so that the plate portion of the covering member is maintained to be parallel.

The method for mounting a circuit module according to the present invention comprises the steps of preparing a mother circuit board, constructing the circuit module by mounting electronic components on a daughter circuit board, attaching a covering member to the daughter circuit board, carrying the circuit module by chucking the covering member with a chucking device, and mounting the circuit module on the mother circuit board.

In the present invention, the mother circuit board is a circuit board contained in a communication device, etc., and is loaded with circuit modules and electronic components which perform circuit functions in the communication device. The daughter circuit board is a circuit board of a circuit module mounted on the mother circuit board contained in the communication device. The circuit module is, for example, a power supply module including a DC—DC converter. The daughter circuit board is provided with an electric power circuit and a control circuit, and electronic components such as a transformer, regulator, switching element, capacitor, IC, etc., are mounted on one of the surfaces or on both surfaces. The covering member includes one or more supporting portions engaging with the daughter circuit board and a plate portion supported by the supporting portion so as to be parallel to the surface of the daughter circuit board. The plate portion is approximately perpendicular relative to the chucking device and the area of the plate portion is sufficient for the chucking. Thus, the aperture of the chucking device may be determined in accordance with the weight of the circuit module. Accordingly, the chucking device can chuck and lift the circuit module, which is relatively heavy compared to other independent electronic components, and carry the circuit module to the mother circuit board. In addition, some or all of the parts of the plate portion may be disposed at the center of the daughter circuit board, which is the center of gravity, so that the circuit module may be lifted by the chucking device in a balanced manner.

Figure 1:
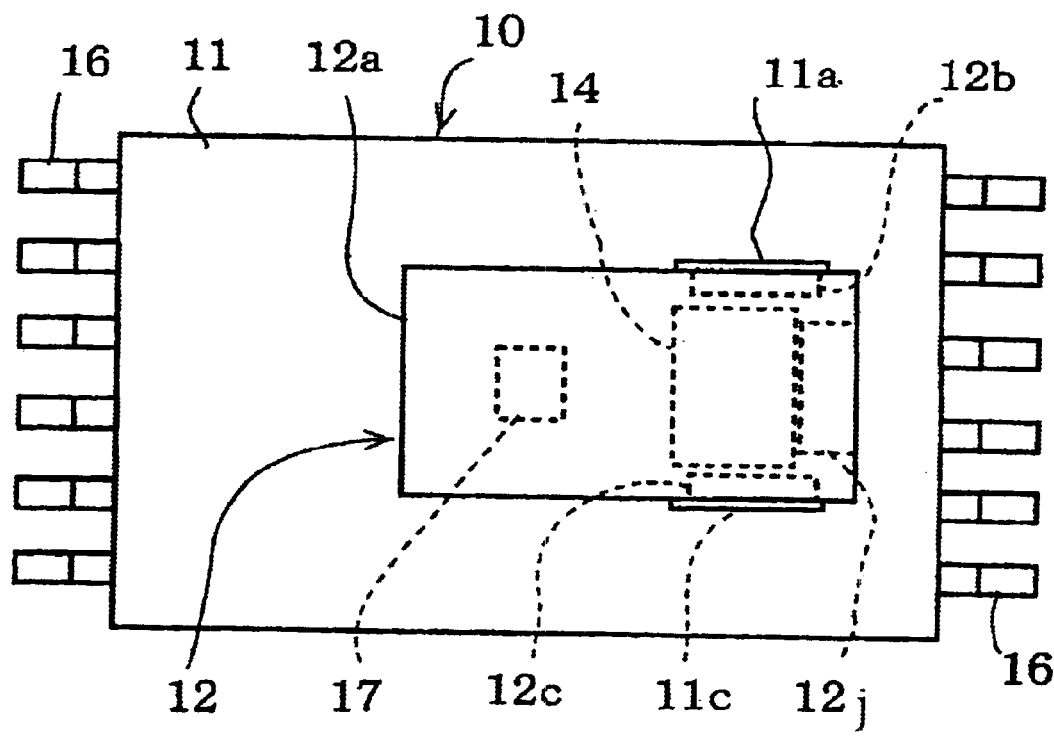
FIG. 1 is a plan view of a circuit module according to the present invention.
Figure 2:
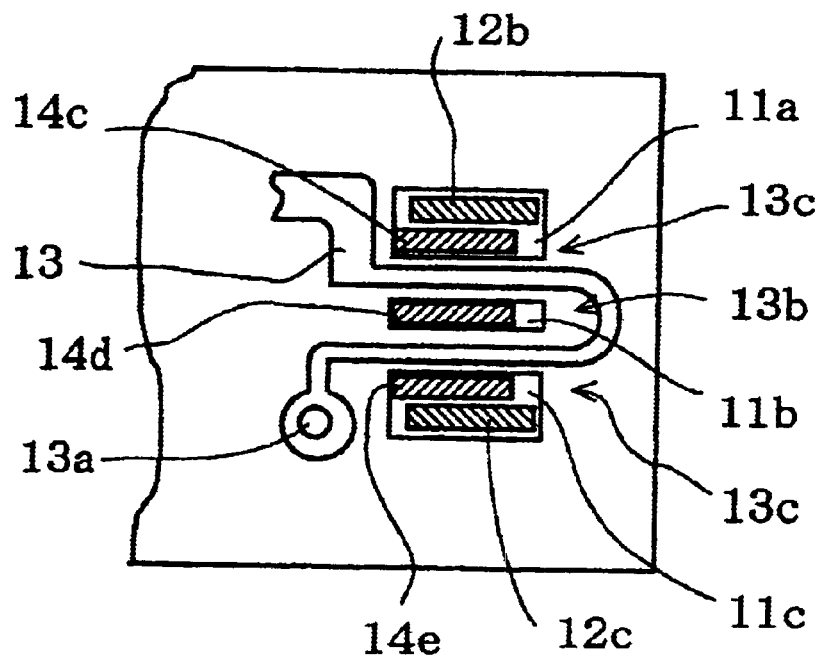
FIG. 2 is a cross sectional view of a part of the circuit module shown in FIG. 1.

Hereinafter, embodiments of the present invention will be described below with reference to the accompanying drawings. FIG. 1 is a plan view of a circuit module according to the present invention. To simplify the drawing, almost all of the electronic components are omitted. FIG. 2 is a sectional view showing a part of the circuit module 10 shown in FIG. 1. The circuit module 10 includes a multi-layer circuit board 11 and a covering member 12, both having a rectangular shape. In consideration of heat-resistance, the multi-layer circuit board 11 is formed with an epoxy resin which contains fiberglass, and the covering member 12 is formed with a polyester resin which contains fiberglass. The multi-layer circuit board 11 is provided with electric wires between the layers, although this is not shown in the figure. The electric wires provided between the layers are connected by via holes with electric wires provided in the top and the bottom surfaces of the multi-layer circuit board 11, although this is not shown in the figure, and thus predetermined circuit wiring is formed. In addition, coil patterns 13 are formed in the multi-layer circuit board 11 by using the top surface, the bottom surface, and the region between the layers of the multi-layer circuit board 11. The coil patterns 13 are connected by a plurality of via holes 13a, so as to form two coils. These two coils are arranged vertically relative to each other, using the region between the layers of the multi-layer circuit board 11. The shape of the coil patterns is appropriately selected from a spiral, circle, arc, etc., in consideration of the winding numbers and the inductance. The multi-layer circuit board 11 is also provided with lead terminals 16 and 16, which are connected with the electric wires. In addition, through holes 11a, 11b, and 11c are formed in the multi-layer circuit board 11, at the center 13b and in the surrounding region 13c of the coils.

The covering member 12 includes a plate portion 12a which extends to the center of the multi-layer circuit board 11, and of which the upper surface forms a flat surface without concavities or convexities. Although the area of the plate portion 12a is smaller than that of the multi-layer circuit board 11, it is sufficient for the chucking by the chucking device. The two opposing sides (two ends in the lateral direction) of the plate portion 12a are provided with supporting portions 12b and 12c, which are formed at positions closer to one of the other two opposing sides (two ends in the longitudinal direction). One of the two opposing sides in the longitudinal direction, which is closer to the positions where the supporting portions 12b and 12c are formed, is provided with a pressing member 12d. The plate portion 12a, the supporting portions 12b and 12c, and the pressing member 12d are formed in one block. The cores 14 are disposed between the two supporting portions 12b and 12c, and abut against the pressing member 12d. Leg portions 14c and 14e of the cores 14 are inserted through the through holes 11a and 11c, through which the supporting portions 12b and 12c are also inserted. Leg portions 14b of the cores 14 are inserted through the through hole 11b. An electronic component 17 shown by dotted lines in the figure is connected to electric wires, which are not shown in the figure, and is soldered on the surface of the multi-layer circuit board 11.

FIG. 4 shows a part of the circuit module shown in FIG. 1, seen from the side where the pressing member is provided. The supporting portions 12b and 12c are formed by extending vertically downward from the plate portion 12a of the covering member 12. The supporting portions 12b and 12c are provided with outwardly facing hook portions 12d and 12e at the distal ends, the hook portions 12d and 12e serving as attaching portions. The plate portion 12a is provided with thickened portions 12f and 12g on the bottom surface, at the position near the position where the supporting portions 12b and 12c are provided. The supporting portions 12b and 12c are plate-formed tongue pieces, having some elasticity in the lateral direction of the plate portion 12a so that they can be slightly bent. The end portions of the supporting portions 12b and 12c are inserted through the through holes 11a and 11c formed in the multi-layer circuit board 11, from the upper surface 11d of the multi-layer circuit board 11. Accordingly, the hook portions 12d and 12e are engaged with the edges of the through holes 11a and 11c, respectively, at the bottom surface 11e of the multi-layer circuit board 11. Similar to the supporting portions, the pressing member 12d is also extended vertically downward from the plate portion 12a of the covering member 12. The end portion of the pressing member 12h is not in contact with the upper surface 11d of the multi-layer circuit board 11. The pair of E cores 14 are disposed in the space surrounded by the plate portion 12a and the supporting portions 12b and 12c, and are fixed to each other by a metal fitting 15. One of the E cores 14 is shown in FIG. 3A.

FIG. 5 is a sectional view of a part of the multi-layer circuit board 11 where the E cores 14 are fixed, showing the manner in which the cores 14 are clamped by the metal fitting in the space surrounded by the multi-layer circuit board 11 and the covering member 12. The pair of E cores 14a and 14b are fixed to each other by inserting leg portions 14c, 14d, and 14e into the three through holes 11a, 11b, and 11c from the upper and the bottom surfaces 11d and 11e of the multi-layer circuit board 11. Accordingly, the E cores 14a and 14b form closed magnetic paths. The core 14a at the upper side and the core 14b at the lower side are clamped by the U-shaped metal fitting 15, forming a core unit 24. The metal fitting 15 is, for example, a flat spring.

The metal fitting 15 is formed from a spring material, and is provided with two leg portions 15a and 15b which are parallel to each other in the stationary state as shown in FIG. 10A. A crossbeam 15c which connects the two leg portions 15a and 15b is bent at the midsection so as to form a concavity 15d, and the ends of the leg portions 15a and 15b are bent inward so as to form hook portions 15e and 15f. When the metal fitting 15 engages with the core unit 24, it receives force in the direction shown by arrows and deforms as shown in FIG. 5, clamping the two cores 14a and 14b. More specifically, the metal fitting 15 deforms so as to arrange two convex portions 15g and 15h in line. In addition, free ends of the leg portions 15a and 15b tilt inward so as to come closer to each other, and each of the hook portions 15e and 15f engages with the core 14b at the corners thereof. Accordingly, the two cores 14a and 14b are held together. As shown in FIG. 5, the convex portions 15g and 15h are pressed downward by the bottom surface and the thickened portions 12f and 12g provided to the plate portion 12a. Thus, the bottom portion 14f of the core 14a which is disposed at the upper side is pressed against the surface of the multi-layer circuit board 11. The leg portions 15a and 15b of the metal fitting 15 are supported by the supporting portions 12b and 12c. Accordingly, the core unit 24 is retained in both the vertical and the horizontal directions relative to the multi-layer circuit board 11 so as not to rattle.

FIG. 6 shows a part of the circuit module shown in FIG. 1 as seen from one of the sides of the supporting portions. The upper surface of the plate portion 12a of the covering member 12 is arranged to be parallel with multi-layer circuit board 11. The supporting portions 12b and 12c of the covering member 12 are provided with a step portion 12h at the side where the pressing member 12d is provided, and the step portion 12h is pressed against the surface of the multi-layer circuit board 11. More specifically, the stop portion 12h and the above-described hook portions 12d and 12e serve as the attaching portions of the supporting portions 12b and 12c. The end surface of the step portion 12 and the hook portions 12d and 12e clamp the multi-layer circuit board 11 so that the covering member 12 is fixed to multi-layer circuit board 11. In this construction, the end surface of the step portion 12h is parallel to the upper surface of the plate portion 12a. Accordingly, when the covering member 12 is fixed to the multi-layer circuit board 11, the upper surface of the plate portion 12a is parallel to the surface of the multi-layer circuit board 11. In addition, even when the chucking device chucks the plate portion 12a so that an upward force shown by the arrow A is applied to the free end of the plate portion 12a, the plate portion 12a is maintained to be parallel to the multi-layer circuit board 11. The plate portion 12a extending to the midsection of the multi-layer circuit board 11 is provided with a protrusion 12i which is slightly protruding from the bottom surface. The protrusion 12i is in contact with the top portion of the electronic component 17 which is positioned at the center of the multi-layer circuit board 11. When there is a risk that the chucking device will press down the plate portion 12a when it chucks the plate portion 12a so as to tilt the plate portion 12a, the plate portion 12a can be maintained to be parallel to the multi-layer circuit board 11 by the following method. That is, the protruding amount of the protrusion 12i supported by the electronic component 17 is adjusted in such a way that the height of the plate portion 12a at the cores of the transformer and at the electronic component 17 will be the same. Accordingly, the plate portion 12a is supported in parallel with the multi-layer circuit board 11. The plate portion 12a is constantly maintained in a manner such that it does not tilt relative to the chucking device, and thus chucking errors are avoided. In addition, even when the plate portion 12a has an elongated shape, the supporting portions 12b and 12c, and the electronic component 17 support the plate portion 12a so as to reduce stress applied to the supporting portions 12b and 12c.

FIG. 7 is a sectional view of a part of the circuit module shown in FIG. 1 at the midsection in the lateral direction. The pressing member 12h presses the core 14a at the side thereof against the inner wall of the through holes 11a, 11b, and 11c. Accordingly, the core unit 24 does not rattle or move inside the through holes 11a, 11b, and 11c in the longitudinal direction of the plate portion 12a.

FIG. 8 shows a covering member incorporated in a second embodiment. The covering member 22 has a supporting portion 22c which is provided with two steps 22h and 22j. The supporting portion 22c is also provided with a hook portion 22d at the distal end, in a manner similar to that in FIG. 4. The end portion of the supporting portion 22c is inserted into the through holes 11a formed in the multi-layer circuit board 11. The steps 22h and 22j are pressed against the surface of the multi-layer circuit board 11, and the hook portion 22d is engaged with the edge of the through hole 11a at the bottom surface of the multi-layer circuit board 11. Accordingly, the steps 22h and 22j and the hook portion 22d clamp the multi-layer circuit board 11. With such a construction, the plate portion 22a is maintained parallel to the multi-layer circuit board 11 without utilizing one of the electronic components as a support. In this case, the protrusion 12i as shown in FIG. 6 is not necessary.

FIG. 9 shows a covering member incorporated in a third embodiment. A tongue piece 32d extends from the midsection of the pressing portion shown in FIG. 7. The tongue piece 32d is inserted into the middle through hole 11d along with the middle leg portions 14d of the cores 14, preventing the rattling of the cores.

FIG. 11 shows a covering member incorporated in a fourth embodiment. In contrast to the one shown in FIG. 4, the covering member 42 has supporting portions 42b and 42c which are provided with pressing portions 42e and 42d. The pressing portions 42e and 42d press the cores at the sides thereof, as in the case described above with reference to FIG. 4.

FIG. 12 shows a covering member and a core unit incorporated in another embodiment. The two E cores are fixed to each other by affixing the end surfaces 34a of the leg portions 14c, 14d, and 14e in the through holes 11a, 11b, and 11c with an adhesive, for example, an instantaneously bonding adhesive. Accordingly, the two E cores form a core unit 34. A plate portion 52a of a covering member 52 is provided with a resilient portion 52d which is protruding from the bottom surface. The resilient portion 52d is formed to have a thin arc shape, and has some degree of elasticity so that it can be deformed. Constructions and functions of the supporting portions 52b and 52c and hook portions 52e and 52f are the same as in the cases described above with reference to FIGS. 4 to 9. The covering member 52 is attached to the multi-layer circuit board 11 over the core unit 34, and the resilient portion 52d presses the core 14a against the surface of the multi-layer circuit board 11, preventing the rattling or the displacement of the cores.

Although the two above-described two cores were aligned vertically relative to the multi-layer circuit board 11, the two cores may also be juxtaposed on the surface or between the layers of the multi-layer circuit board 11. In such a case, through holes are formed at the centers of the coils, and U-shaped cores as shown in FIG. 3B are attached. When there is only one coil, such as a choke coil, through holes are formed at the center of the coils and in the surrounding region, and U-shaped cores or E cores are attached. In addition, although the two E cores 14 were used in the above-described embodiments, a combination of one E core and an I-shaped core, as shown in FIG. 3C, may also be used. Similarly, a U-shaped core may also be used in combination with an I-shaped core. In addition, the crossbeam 25c of the metal fitting may be formed in the shape of an arc, as shown in FIG. 10B. When this type of metal fitting 25 is attached to the core, the metal fitting 15 receives forces in the directions shown by the arrows. Accordingly, end portions of leg portions 25a and 25b come closer to each other, so that hook portions 25e and 25f and the crossbeam 25c clamp the cores.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A circuit module comprising:
   a covering member which has a plate portion and at least one supporting portion; and
   a multi-layer circuit board having electric wires between layers;
   a transformer including coils, which are defined by coil patterns disposed in the multi-layer circuit board, and cores, which form magnetic paths by one or more leg portions of the cores being disposed in through holes of the circuit board positioned at a center and in a surrounding region of the coils;
   wherein the at least one supporting portion fixes the plate portion in parallel to the surface of the circuit board, the covering member is defined by a portion of the at least one supporting portion extending from the plate portion in the direction perpendicular to the plate portion, the at least one supporting portion is provided with attaching portions at distal ends, and the attaching portions are engaged with the through holes in the circuit board.

2. The circuit module according to claim 1, wherein two cores are provided, the two cores attached to each other from upper and lower sides of the circuit board, and being fixed to each other by an elastic metal fitting, and wherein one of the cores is immovably held between the plate portion of the covering member and the multi-layer circuit board.

3. The circuit module according to claim 1, wherein the covering member comprises a pressing portion for pressing the leg portions of one of the cores against an inner wall of the through holes.

4. The circuit module according to claim 2, wherein the covering member comprises a pressing portion for pressing the leg portions of one of the cores against an inner wall of the through holes.

5. The circuit module according to claim 1, wherein the cover member further comprises a pressing portion for pressing the leg portions of one of the cores against an inner wall of the through holes and the pressing portion has a tongue piece which is inserted into one of the through holes.

6. The circuit module according to claim 1, wherein the supporting portions have a pressing portion for pressing a side of the cores.

7. The circuit module according to claim 1, wherein the plate portion has a resilient portion for pressing a top of the cores.

8. A circuit module having a multi-layer circuit board on on which a transformer is disposed and on which at least one electronic component other than the transformer is mounted, the transformer including coils which are defined by coil patterns disposed in the multi-layer circuit board, at least one through hole which is drilled in the multi-layer circuit board at a center and in the surrounding region of the coils, and cores forming magnetic paths by one or more leg portions being disposed in the at least one through hole, the circuit module comprising:

a covering member which a has plate portion and at least one supporting portion;

wherein the at least one supporting portion is engaged with the at least one through hole so as to arrange the plate portion to be parallel to the multi-layer circuit board.

9. The circuit module according to claim 8, wherein the at least one supporting portion is provided with attaching portions at distal ends, the attaching portions including a step portion which contacts one of the surfaces of the multi-layer circuit board and hook portions which are engaged with the edges of the at least one through holes at an opposite surface of the multi-layer circuit board.

10. The circuit module according to claim 8, wherein two cores being provided, the two cores are attached to each other from upper and lower sides of the circuit board, and being fixed to each other by an elastic metal fitting, and wherein the at least one supporting portions of the covering member have dimensions such that the plate portion presses one of the cores against the surface of the multi-layer circuit board.

11. The circuit module according to claim 9, wherein two cores are provided, the two cores being attached to each other from upper and lower sides of the circuit board, and being fixed to each other by an elastic metal fitting, and wherein the at least one supporting portions of the covering member have dimensions such that the plate portion presses one of the cores against the surface of the multi-layer circuit board.

12. The circuit module according to claim 8, wherein the covering member comprises a pressing portion for pressing the leg portions of one of the cores against an inner wall of the at least one through hole.

13. The circuit module according to claim 9, wherein the covering member comprises a pressing portion for pressing the leg portions of one of the cores against an inner wall of the at least one through hole.

14. The circuit module according to claim 10, wherein the covering member comprises a pressing portion for pressing the leg portions of one of the cores against an inner wall of the at least one through hole.

15. The a circuit module according to claim 8, wherein the plate portion of the covering member is provided with a protrusion on a bottom surface, the protrusion contacting a top of one of the at least one electronic component other than the transformer.

16. The circuit module according to claim 9, wherein the late portion of the covering member is provided with a protrusion on a bottom surface, the protrusion contacting a top portion of one of the at least one electronic component other than the transformer.

17. The circuit module according to claim 10, wherein the plate portion of the covering member is provided with a protrusion on a bottom surface, the protrusion contacting a top portion of one of the at least one electronic component other than the transformer.

18. The circuit module according to claim 12, wherein the plate portion of the covering member is provided with a protrusion on a bottom surface, the protrusion contacting a top portion of one of the at least one electronic component other than the transformer.

19. The circuit module according to claim 9, wherein the attaching portions further include another step portion which contacts the same surface of the multi-layer circuit board as the step portion on the opposite side of the at least one through hole.

20. The circuit module according to claim 2, wherein the cover member further comprises a pressing portion for pressing the leg portions of one of the cores against an inner wall of the at least one through hole and the pressing portion has a tongue piece which is inserted into the at least one through hole.

21. The circuit module according to claim 8, wherein the supporting portions have a pressing portion for pressing a side of the cores.

22. The circuit module according to claim 8, wherein the plate portion has a resilient portion for pressing a top of the cores.

* * * * *